(12) United States Patent
Liu et al.

(10) Patent No.: US 7,750,445 B2
(45) Date of Patent: Jul. 6, 2010

(54) STACKED SYNCHRONOUS BUCK CONVERTER

(75) Inventors: Yong Liu, Scarborough, ME (US);
Qiuxiao Qian, Singapore (CN);
Honorio T. Granada, Jr., Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 8 days.

(21) Appl. No.: 11/857,199

(22) Filed: Sep. 18, 2007

(65) Prior Publication Data

US 2009/0072359 A1   Mar. 19, 2009

(51) Int. Cl.
*H01L 23/495* (2006.01)

(52) U.S. Cl. .................. 257/675; 257/666; 257/686; 257/704; 257/706; 257/E23.051

(58) Field of Classification Search ............. 257/724, 257/675, 666, 686, 704, 706, E23.051
See application file for complete search history.

(56) References Cited

U.S. PATENT DOCUMENTS

2002/0066950 A1 *   6/2002   Joshi ................ 257/685
2004/0061221 A1 *   4/2004   Schaffer ............ 257/723
2004/0125573 A1    7/2004   Joshi et al.
2005/0285238 A1   12/2005   Joshi et al.
2006/0261453 A1   11/2006   Lee et al.
2007/0132079 A1    6/2007   Otremba et al.
2007/0164428 A1    7/2007   Elbanhawy et al.

OTHER PUBLICATIONS

International Search Report and Written Opinion from corresponding PCT application (PCT/US2008/076501) dated May 18, 2009 completed by the ISA/KR (Korean Intellectual Property Office) (total 8 pgs.).

* cited by examiner

*Primary Examiner*—David A Zarneke
*Assistant Examiner*—Jenny L Wagner
(74) *Attorney, Agent, or Firm*—Thomas R. FitzGerald, Esq.; Hiscock & Barclay, LLP

(57) ABSTRACT

A multichip module buck converter 10 has a high side power mosfet 12, a low side power mosfet 22 and a pre-molded leadframe 40 between the two mosfets for connecting the source of mosfet 12 to the drain of mosfet 22. Clips 14, 16, 18 and 26 carry the source, gate and drain terminals of the mosfet from planes parallel but spaced apart to a common plane.

15 Claims, 11 Drawing Sheets

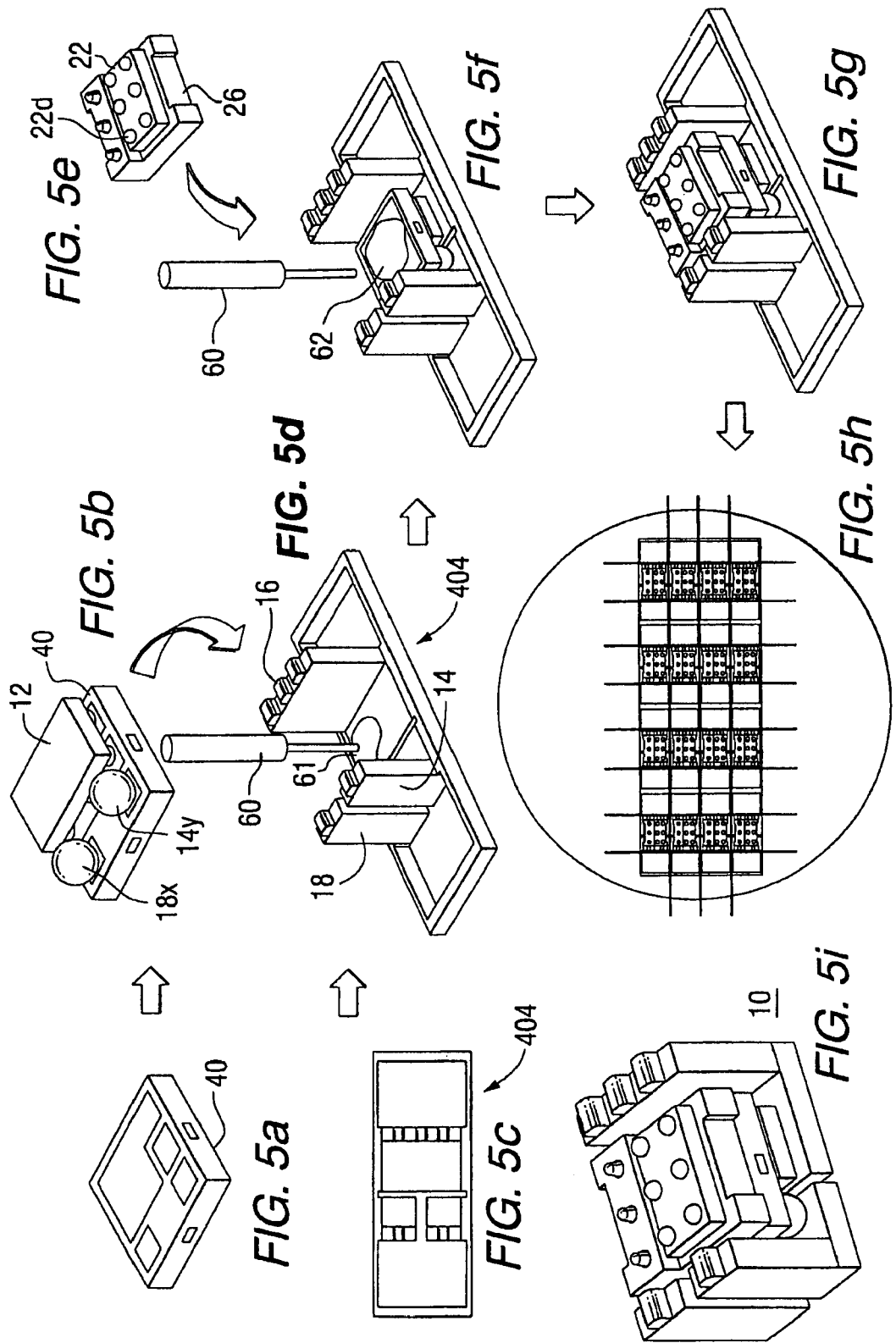

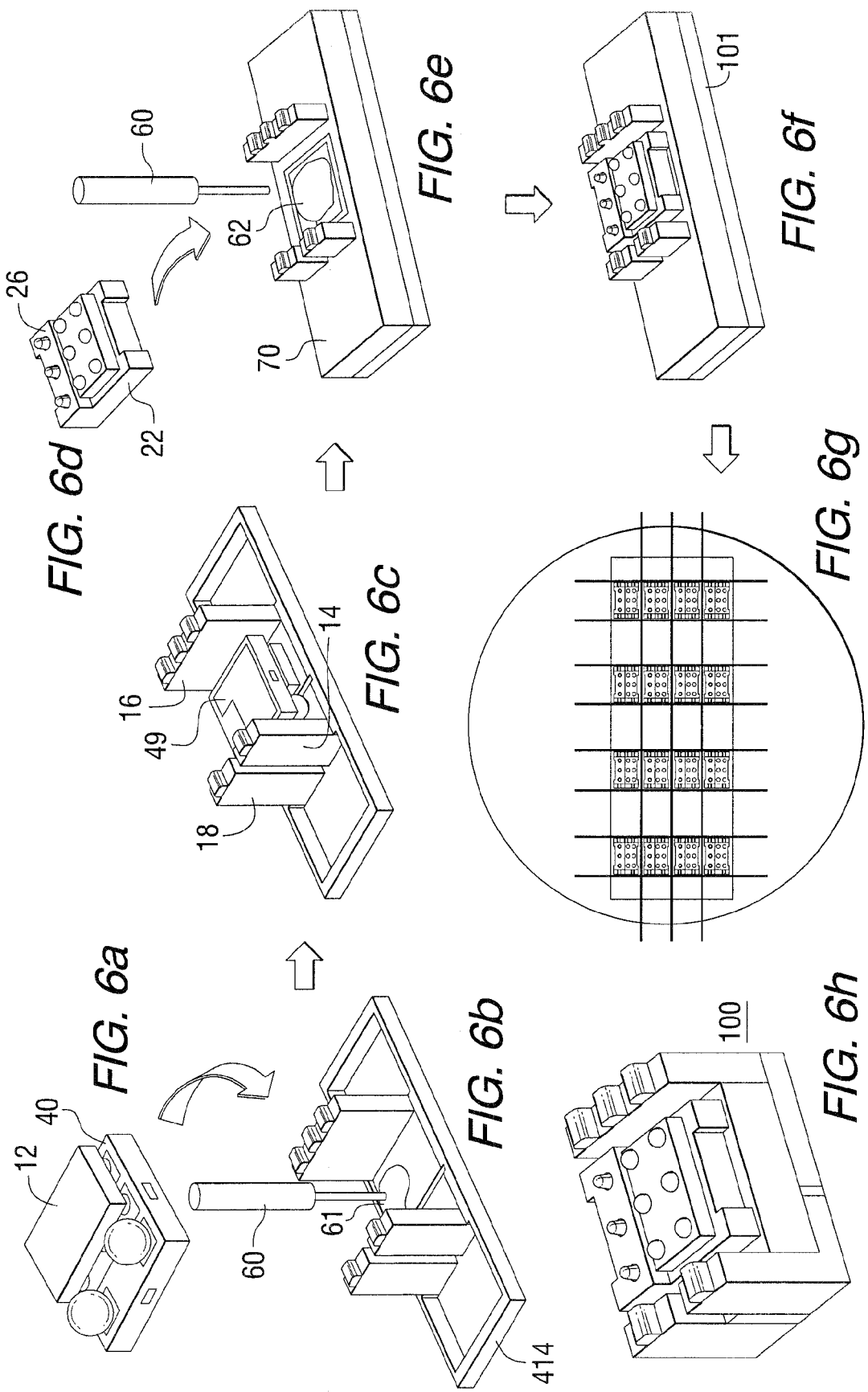

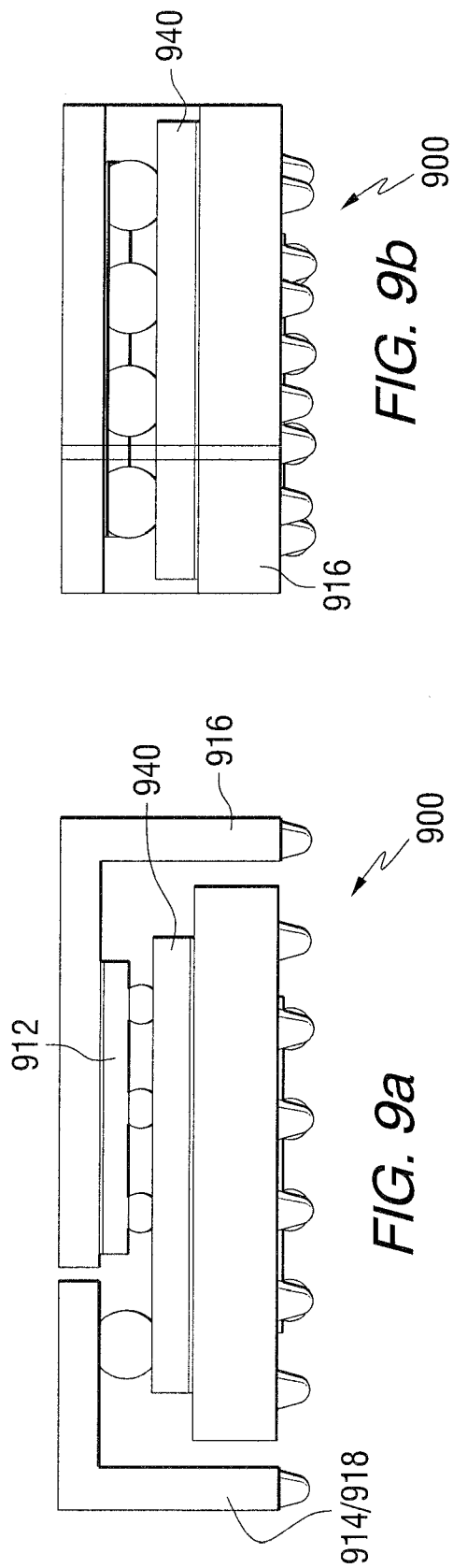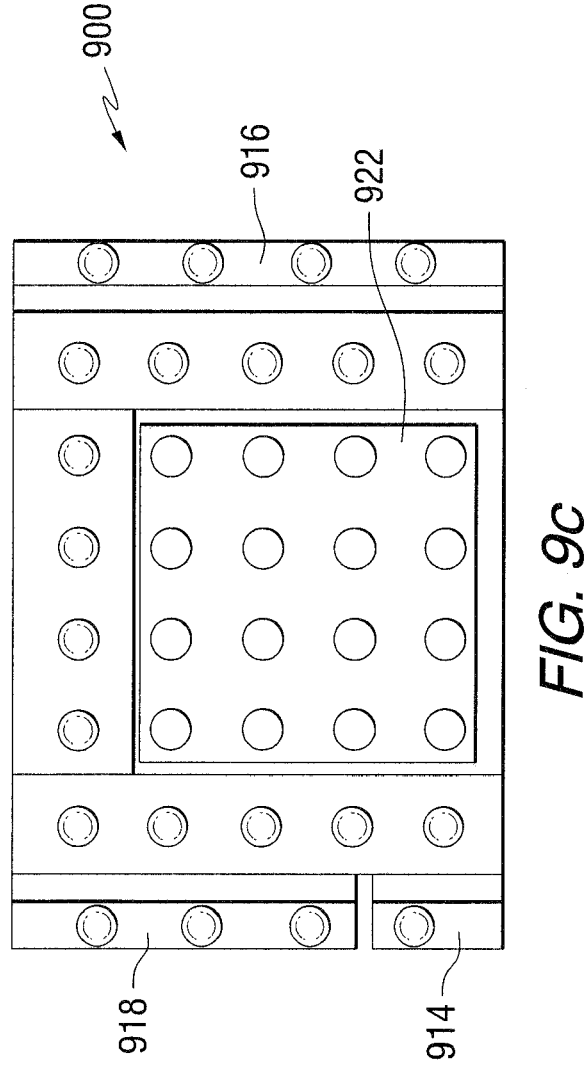

STACKED SYNCHRONOUS BUCK CONVERTER

BACKGROUND

Power supplies for computers, personal digital assistants, cellular phones and other hand held mobile electronic devices and systems have exacting demands. A buck converter functions to step down a high voltage to a lower voltage so that it is compatible with, for example, a CPU on a motherboard for a personal computer. Typically, the buck converter operates using a clock, whereby an inductor is charged or energized during a first portion of a clock cycle ("charging phase") and operates as a current source during the second portion of the clock cycle ("discharging phase").

A typical buck converter having a synchronous rectifier topology operates by commencing the charging phase in response to a clock signal. During the charging phase, the inductor, capacitor and load are coupled to the input voltage. Meanwhile, the inductor current is monitored, and, when it peaks at a predetermined value, the converter is decoupled from the input voltage and the inductor discharges its energy through the load. Because the separation between the charging and discharging phases is defined at the point in time at which the inductor current peaks at the predetermined value, this type of buck converter is commonly referred to as a "peak current control" buck converter. The inductor current rises and falls linearly according to is the voltage across the inductor.

A buck converter can also be characterized as a step-down switch-mode power supply where the average output voltage can be shown to be directly proportional to the converter duty cycle, D which is the portion of the buck converter clock period during which high-side switch is on.

Buck converters are characterized by having a high side transistor and a low side transistor. Today most buck converters are made with mosfets for the high and low side transistors. Power mosfets are well documented and are often used in buck converters to perform DC to DC conversion.

However, as systems such as handheld devices and cell phones continue to shrink in size, it becomes more important reduce the area on a system circuit board for any given system function. Where two mosfets are wired together on a system board, the area assigned to the wired mosfets is generally more than the area of the individual mosfets because the mosfets in a buck converter must be connected together. Conventional assembly techniques dispose mosfets laterally on a system board. Such assemblies increase parasitic effects due to wiring. As such, it would be beneficial to reduce parasitic performance, reduce the area allotted to the buck converter mosfets and improve the speed and reduce the complexity of assembling a buck converter on a system board.

SUMMARY

The stacked buck converter has high and low side mosfet transistors. Each of the transistors is formed in a semiconductor die with opposite surfaces. Each has, one surface, a drain terminal; on the other surface are source and gate terminals. The stack has a number of auxiliary connectors that are assembled to stack the mosfets on top of each other, connect the high side source to the low side drain, and provide an assembly that has, in a common plane, connections to all the terminals of the transistors. In order to achieve this, a pre-molded leadframe is provided for attachment to both transistors to vertically align them with each other. The pre-molded leadframe is conductive and has selected insulated areas. The exposed areas provide surfaces for connecting the high side source to the low side drain.

Clips are from a metal sheet. A punch is used to form base and leg portions of three clips. The legs are bent upward away for the bases. A subassembly of the pre-molded leadframe and one transistor is attached to the bases. A second subassembly of a clip and the other transistor is attached to the first subassembly. The transistor adjacent the bases of the clip may be encapsulated in insulating molding compound.

The stacked buck converter provides a multichip module that is assembled without the need for bond wires. It arranges its mosfets in a vertical package and thereby saves valuable room on a printed circuit board. Such savings are important where space is limited, as in hand held devices such as cell phones and personal digital assistants. While the goal of saving space is well recognized by those skilled in the art, conventional methods of assembling buck converters normally rely upon laterally assembling high and low side mosfets on a common substrate. In sharp contrast, the invention stacks the dies on each other by using pre-molded leadframe to connect the high side source to the low side drain and then fashions two different configurations of clips to carry the terminals of the stacked transistor to a common plane. The invention achieves assembly without the need for wire bonding and without added expense because the clips and substrates may be made of conventional leadframe material.

In one embodiment, the high side transistor is disposed between the pre-molded leadframe and the bases of the clips. In another embodiment, the low side transistor is disposed between the pre-molded leadframe and the clips. In general, both embodiments reduce the surface area of a buck converter by about 50%.

BRIEF DESCRIPTION OF THE DRAWINGS

FIG. 2b is an electrical schematic of the multichip buck converter module of FIG. 1 and FIG. 2a.

FIGS. 5a-5i show steps forming a multichip buck converter module without epoxy molding compound.

FIGS. 6a-6h show steps forming a multichip buck converter module with epoxy molding compound.

FIGS. 9a-9c show end, side and bottom views of another buck converter.

DETAILED DESCRIPTION

Figure 1:
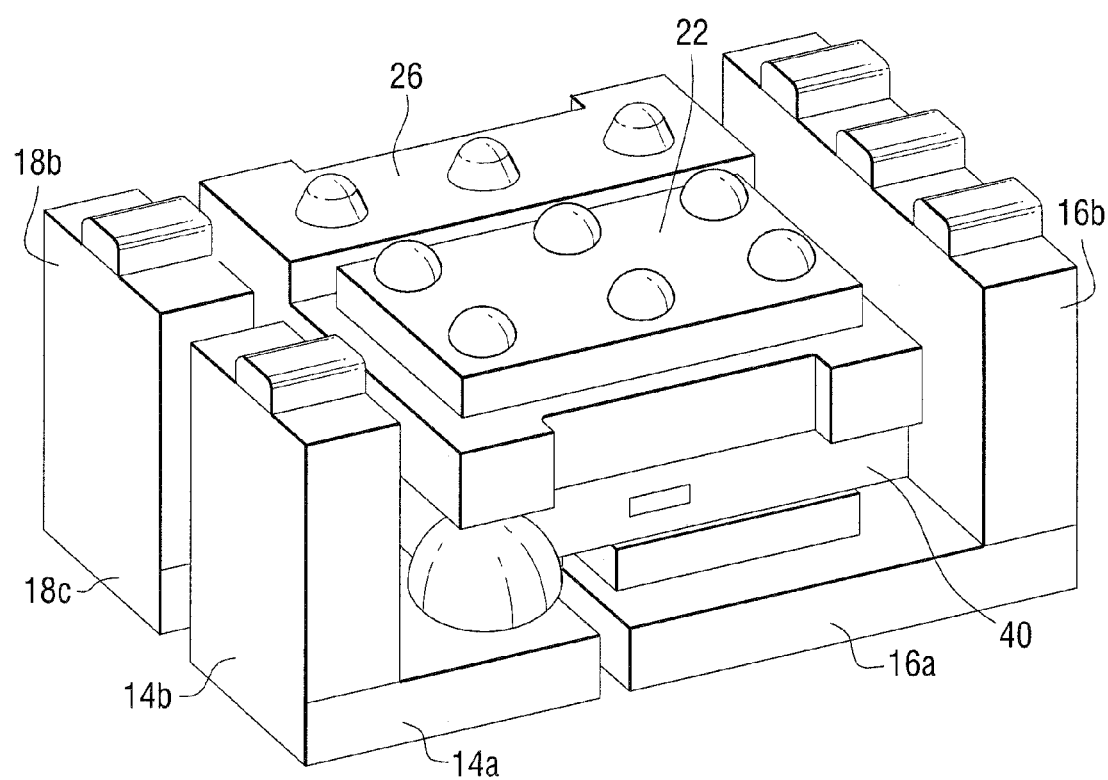
FIG. 1 is a perspective view of a multichip buck converter module.

Turning now to FIG. 1, there is a bottom view of the multichip buck converter module 10. It has a high side power mosfet 12, a low side power mosfet 22 and a pre-molded leadframe 40 between the two mosfets. The pre-molded leadframe 40 has leads with conductors encapsulated in epoxy molding compound 50. The leads terminate on the surfaces of the leadframe to form one or more contact regions or pads as explained below. The leadframe 40 connects the source of the high side mosfet to the drain of the low side mosfet and provides connections to the source and gate of the high side mosfet 12. Clips 14, 16, 18 and 26 carry the source, gate and drain terminals of the mosfet from planes parallel but spaced apart to a common plane.

Clips 14, 16, 18 and 26 are made of conductive material, including, for example, copper, nickel, aluminum or alloys thereof. The surface of the clips may be plated with one or more layers of other conductive materials, such a nickel, palladium and other plating that those skilled in the art may use for conventional leadframes. The clips share a common configuration. Each has a first portion extending parallel to the surface of one of the mosfets and a second portion extending transverse to the surface of the mosfet. High side drain clip 16 has first, base portion 16a that is parallel to the surface of the mosfet 12 and a second, leg portion 16b that is transverse to the surface of the mosfet 12 and extends away from the base 16b. Portions 14a, 16a, 18a are base portions and lie in a common plane. Portions 14b, 16b, 18b are leg portions and extend in the same direction away from their respective base portions.

High side drain clip 16 has parallel portion 16a connected to the high side drain of the power mosfet 12. High side gate clip 14 has its parallel portion 14a connected to a high side gate contact ball 15 which is connected via lead frame 40 to the gate of the high side mosfet 12. Lead frame 40 has, on one surface, high side gate clip contact region 44 for contacting the clip 14 via contact ball 15. It also has high side gate die contact region 41 for contact to the gate terminal of the high side mosfet 12. Inside the leadframe 40, other leads (not shown) connect together contact regions 44 and 41 of the pre-molded leadframe 40. High side source clip 18 has its parallel portion 14a connected to the high side source ball contact 17 of the high side mosfet 12. Ball contact 17 is between the high side drain clip 18 and high side source contact region 48 on the pre-molded leadframe 40.

Low side drain clip 26 has one surface of its parallel portion connected to the drain of the low side mosfet 22 and its other surface soldered to the clip contact pad 49 of the performed lead frame 40. The transverse portion 26b extends toward a plane containing the ball grid array contacts to the source and gate of the low side mosfet 22.

The pre-molded leadframe 40 has contacts on both sides. On one surface, it has gate die contact region 41 and gate clip contact region 44. The two regions are internally connected together by leads, not shown, that are embedded in the electronic molding compound 45. The gate of the high side mosfet 12 connects to the gate die contact region 41 and the high side gate clip is connected to the gate clip contact via ball contact 15. The gate terminal of the high side mosfet 12 is thus electrically connected through the contact regions 41, 44, the ball contact 15 and the clip 14.

On the same surface as the gate contacts, the pre-molded leadframe 40 has source die contact region 42 and source clip contact region 48. The two regions 42, 48 are internally connected together by leads, not shown, that are embedded in the electronic molding compound. The source clip contact region 42 is larger than the source clip contact region 48 because the source contact region 42 makes contact with the source region on the surface of the high side mosfet 12. The source of the high side mosfet 12 is connected to the source die contact region 42 and the high side source clip is connected to the source clip contact via ball contact 17.

The other surface of the pre-molded leadframe 40 has low side drain clip contact pad 49. The drain clip contact pad is connected to the source die contact region 42 through internal leads, not shown, that are encapsulated in the epoxy molding compound 45. As an alternative, the pre-molded leadframe 40 may be made to have a single source pad, which is exposed on both surfaces for attachment on one surface to the source region of the high side mosfet 12 and on its other surface for attachment to the low side drain clip. In both cases, the source terminal of the high side mosfet 12 electrically connects contact regions 42, 48, the ball contact 17 and the clip 18 and through the low side drain clip pad 49 to the low side drain clip 26 and thus to the low side drain of mosfet 22.

Figure 2A:
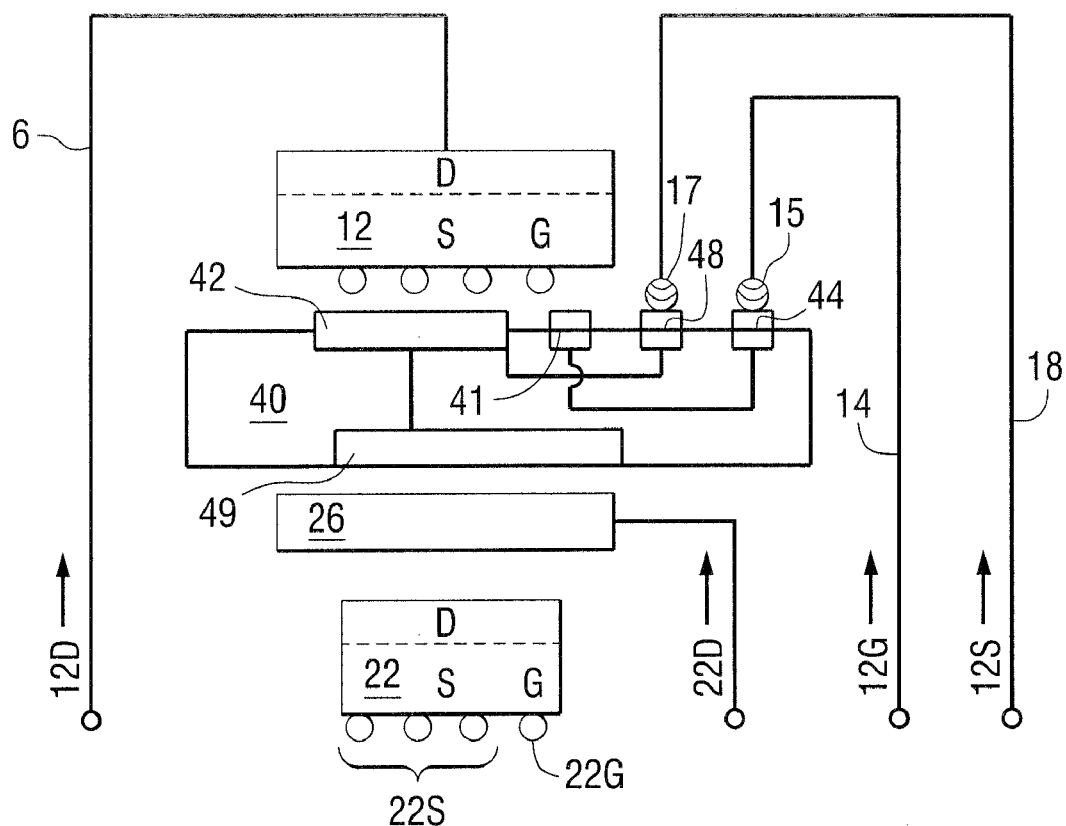
FIG. 2a is a combined mechanical and electrical schematic of the multichip buck converter module of FIG. 1.
Figure 2B:
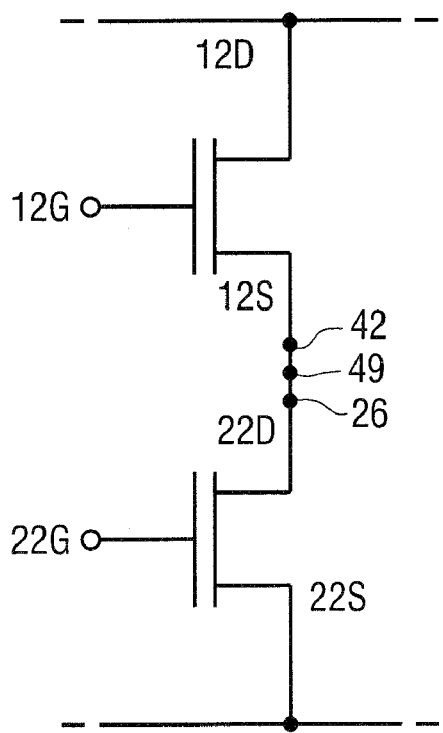

The multichip buck converter module 10 shown in FIG. 1 is also shown in two schematics, FIGS. 2a, 2b. The first schematic, FIG. 2a, is a block diagram showing the relative mechanical locations of the elements of the multichip buck converter module 10 described above. As such, the low side mosfet 22 is on the bottom. Its drain is contacted by drain clip 26. On top of clip 26 is the preformed leadframe 40. Over the leadframe 40 is the high side mosfet 12. Clip 16 connects to the high side drain and clips 14, 18 connect, respectively, to the high side gate and source. The preformed lead from 40 has a lower surface contact pad 49 contacting the surface of the low side drain clip 26 and an upper side source contact pad 42 contacting the source ball grid array 12s. FIG. 2b shows an electrical schematic of the multichip buck converter module 10. The connection between the high side source 12s and the low side drain 22d includes surfaces 42 and 49 of the pre-molded leadframe 40 and drain clip 26. Those skilled in the art will recognize that the multichip buck converter module 10 includes the high and low mosfets 12, 22 that are part of all buck converters.

Figure 3A:
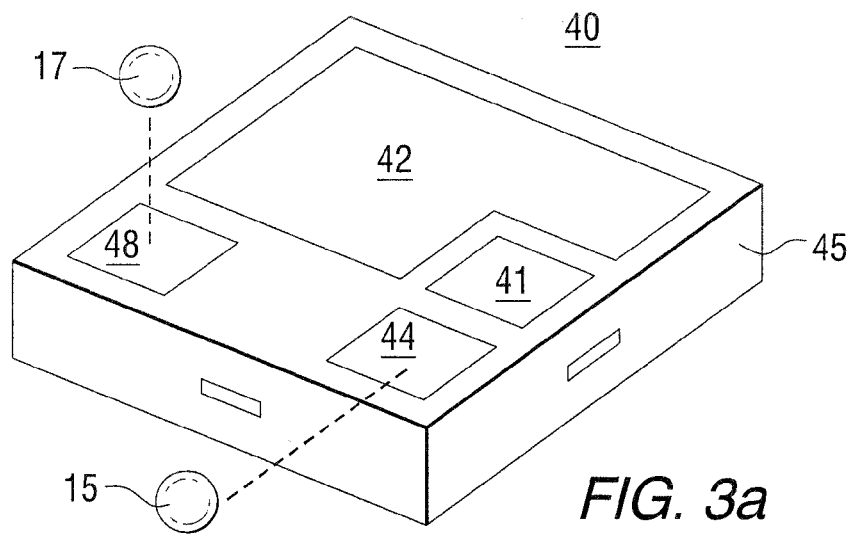
FIG. 3a is a top perspective view of the pre-molded leadframe of the multichip buck converter module.
Figure 3B:
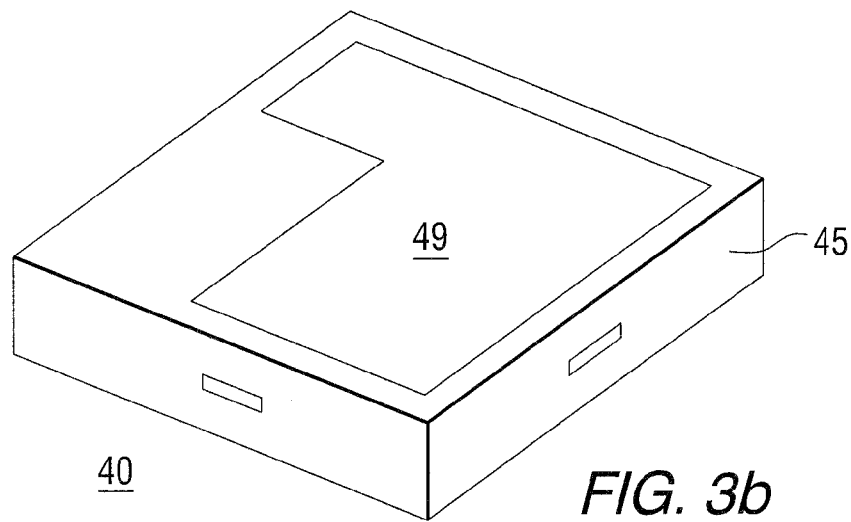
FIG. 3b is a bottom perspective view of the pre-molded leadframe of the multichip buck converter module.
Figure 3C:
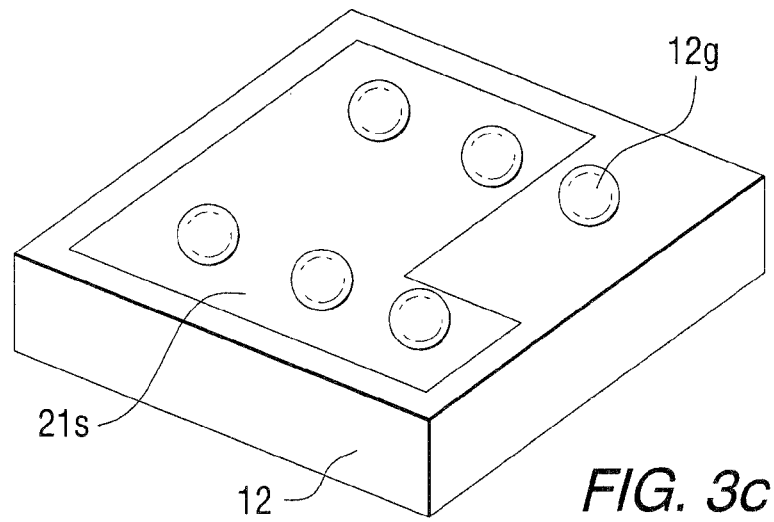
FIG. 3c is a top perspective view of a high side mosfet.

The pre-molded leadframe 40 is more fully shown in FIGS. 3a, 3b. The first figure shows one side of the leadframe 40 that include the contact regions 42, 48 for the high side source and contact regions 41, 44 for the high side gate. FIG. 4 shows a typical high side mosfet 12. The source contacts in region 12s will attach to the source die contact region 42 which connects to the source clip contact 48 via internal leads (not shown). The gate contact 12g will attach to the gate die contact region 41 which connects to the gate clip contact 44 via internal leads (not shown). The other side of the leadframe 40 has a relatively large contact pad 49 which is connected to the source contact region 42 on the opposite surface via internal leads (not shown).

Figure 4A:
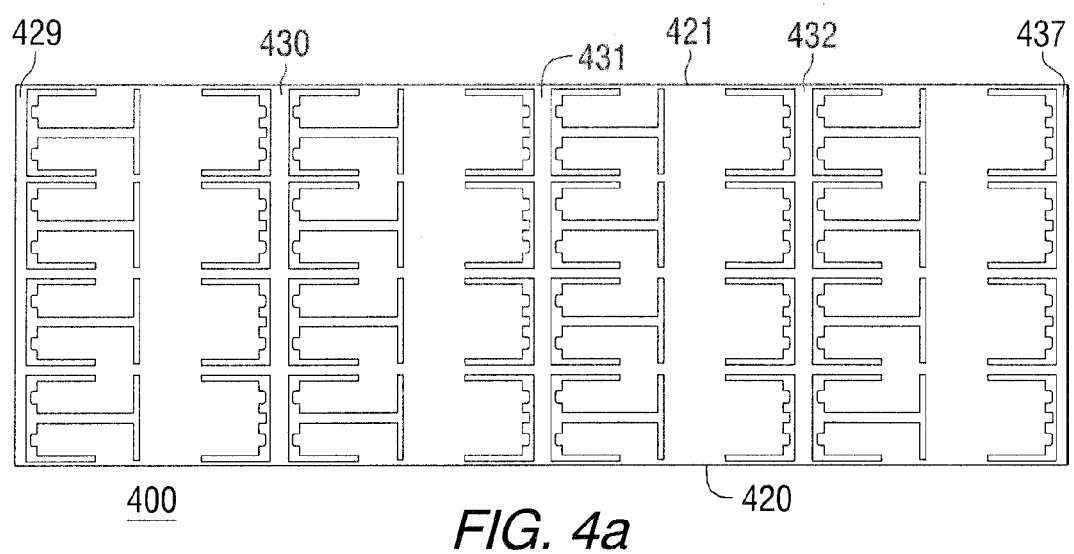
FIGS. 4a-4f show steps for forming high side clips.
Figure 4C:
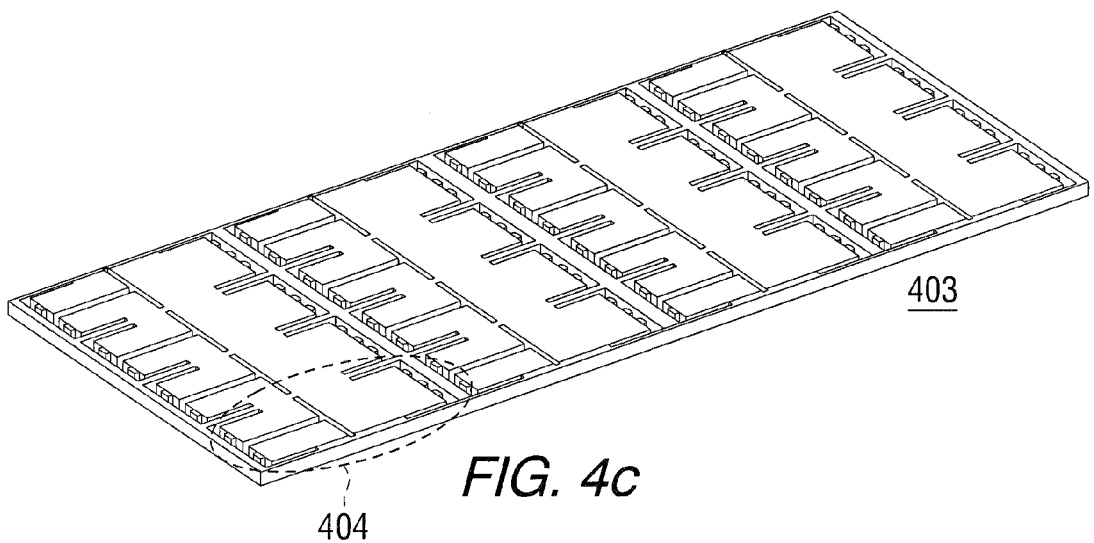
Figure 4D:
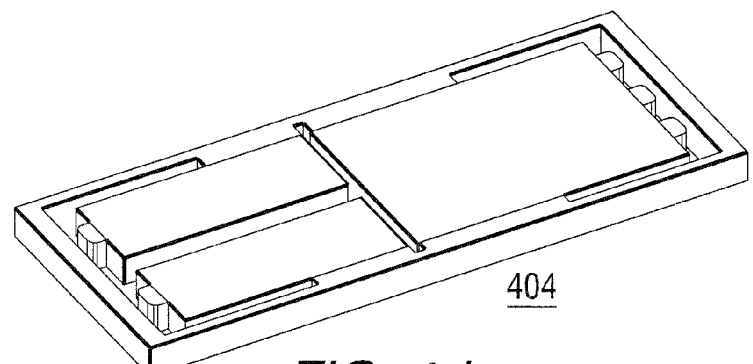
Figure 4B:
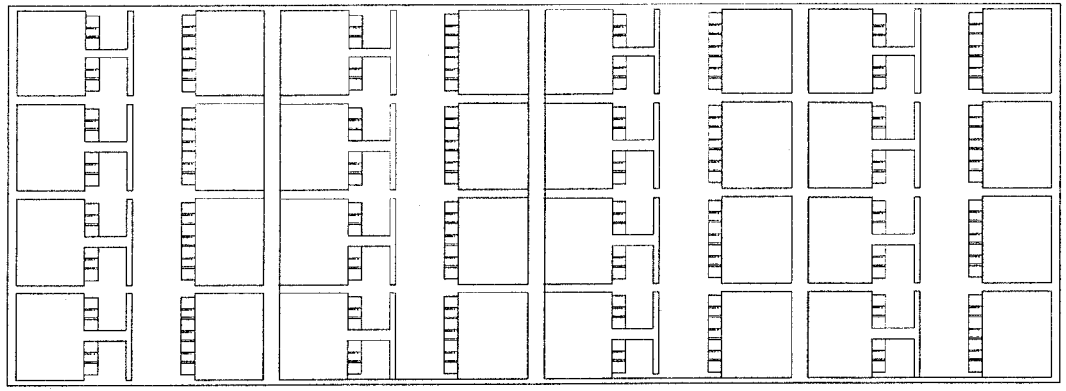
Figure 4E:
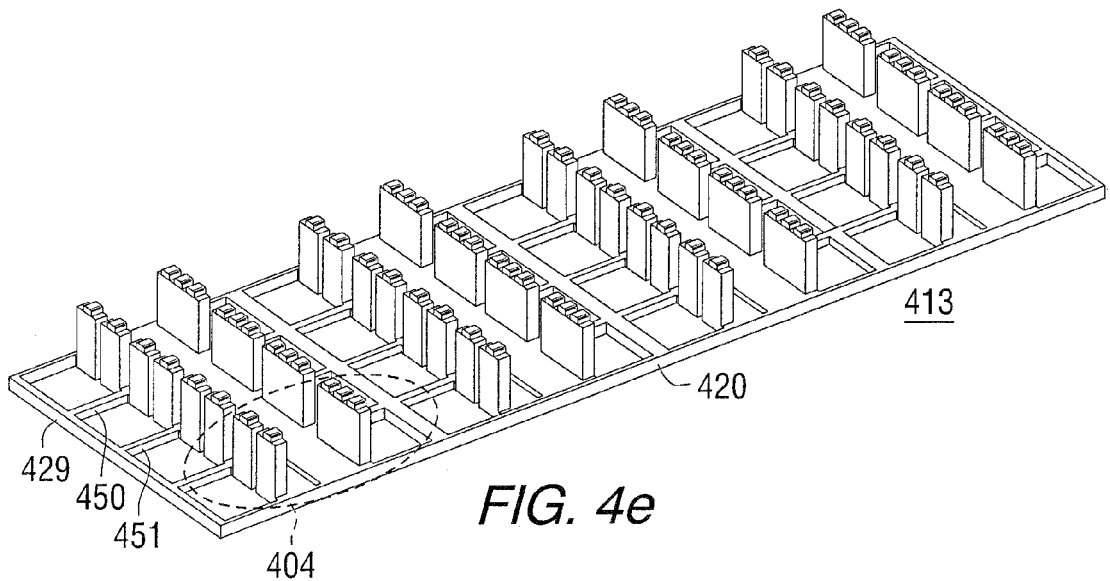
Figure 4F:
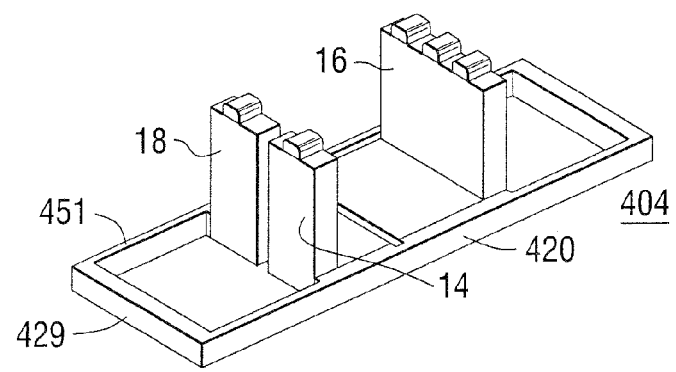

Turning to FIGS. 4a-4f, there are shown steps for forming the source gate and drain clips 14, 16, 18 for the high side transistor 12. In a first step, a clip frame 400 is stamped out of a sheet of metal to form a plurality of interconnected clips. The clip frame 400 has side rails 420, 421. End and intermediate rails 429, 430, 431, 432, 433 extend between the side rails. Together the rails support the folded clips in the frame 400 until the clips are folded and separated from the rails. The clip frame 400 of FIG. 4a has columns of clips with four clips in each column. The clips in FIGS. 4a, 4c and 4d are shown in their folded state in the clip frame 400. FIG. 4d is an enlarged perspective view of one folded clip. Each clip is stamped or punched out of a sheet of metal using dies to form clips with bumps on exposed ends of the clips. In a second step, the clips are folded to form the base portions 14a, 16a, 18a and the leg portions 14b, 16b, and 18b. A plan view of the folding results is shown in FIG. 4b. FIG. 4d is a perspective view of the folded frame 400 and FIG. 4f is an enlarged view of clip 404 in its folded position. Clip 404 in FIG. 4*c* is representative of the each of the clips on the frame 400. It is shown unfolded in FIG. 4*e* and folded in FIG. 4*f*.

Assembly of the multichip buck converter is shown in FIGS. 5*a*-5*i*. A pre-molded leadframe 40 is ball-attached to a power mosfet 12 as shown in FIG. 5*b* and ball contacts 18.*x*, 14.*y* are attached to the source 44 and gate 48 contacts of the pre-molded leadframe 40. Soft solder wire is deposited on the bases 14*a*, 16*a*, and 18*a* of the folded frame 40. Then the subassembly of the mosfet 12 and leadframe 40 is flipped and attached via the soft solder to the bases 14*a*, 16*a*, and 18*a*. Next, the power mosfet 26 is likewise attached to the subassembly. Soft solder 62 is deposited by solder dispenser 60 onto the drain contact 49 of pre-molded leadframe 40. In a parallel process, the mosfet 22 is attached to clip 26. Ball contacts 22.*dddd* are formed on the drain of the mosfet 22 before attaching it to clip 26. The mosfet 22 is attached to the clip 26 with the drain contacts facing up and in the same plane as the source and gate contacts of the clip 22 to provide the further subassembly shown in FIG. 5*g*. It will be recalled that the clip frame 400 may hold 16 multichip modules. The clip frame 400 with subassemblies corresponding to the one shown in FIG. 5*g* is then mounted on suitable tape for separation into individual modules. Those skilled in the art know wafers are often mounted on adhesive tape that is disposed in a circular aperture of the support frame. That same technique is used to mount the 16 modules onto a tape and then the modules are separated from each other by a conventional wafer saw. See FIG. 5*h*. The final products include individual modules 10 as shown in FIG. 5*i*. The completed buck converter is then flipped and mounted on a suitable printed circuit board.

In another embodiment of the invention, the electronic molding compound insulates the mosfet 12. Turning to FIGS. 6*a*-6*h*, steps shown in FIGS. 6*a*, 6*b* are the same as those shown in FIGS. 5*a*, 5*b*. However, after the mosfet 12 is attached to the folded leadframe and before the mosfet 22/clip 26 subassembly is incorporated, the folded leadframe subassembly of FIG. 6*c* is encapsulated in electrical insulating molding compound, typically comprising and insulating resin. The remaining steps are the same as those described above, including soldering the subassembly mosfet 22/clip 26 to the drain contact 49, attaching the sixteen modules in the leadframe 40 to a wafer tape, and separating the modules into individual buck converters using a wafer dicing saw. The completed buck converter is flipped and mounted on a printed circuit board. The insulating compound on the mosfet 12 protects the device from stray contacts with other wire or elements.

Figure 7B:
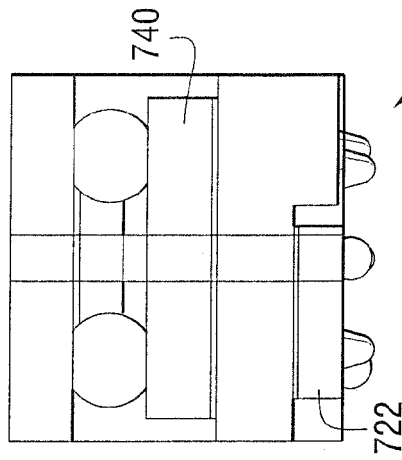
FIGS. 7a-7c show end, side and bottom views of one buck converter.
Figure 7A:
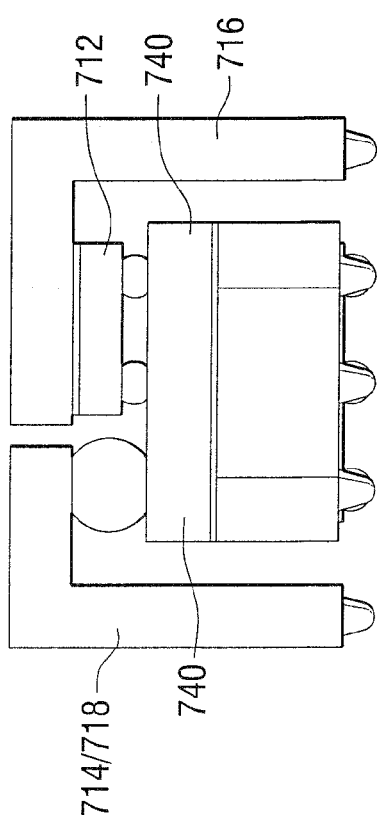
Figure 7C:
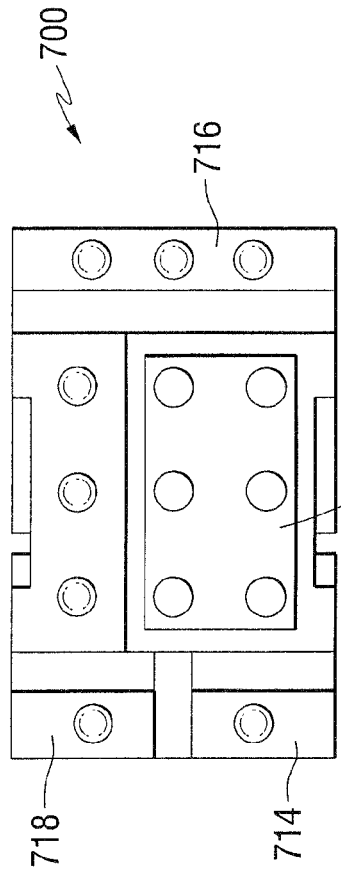

FIGS. 7*a*-7*c* show one embodiment of a buck converter using a pre-molded leadframe 740, a high side mosfet 712, and a low side mosfet 722. Those skilled in the art understand that the ball and/or stud contacts on the bottom of the clips 714, 716, 718 and 726 and the ball contacts for the source and drain of the low side mosfet 722 all lay in a common plane. This feature increases the efficiency of assembling the buck converter multichip module 700 onto a printed circuit board. In this example the low side mosfet 722 is approximately 1.5×1.5 mm in size and the entire module 700 is approximately 2.5×1.5 mm.

Figure 8B:
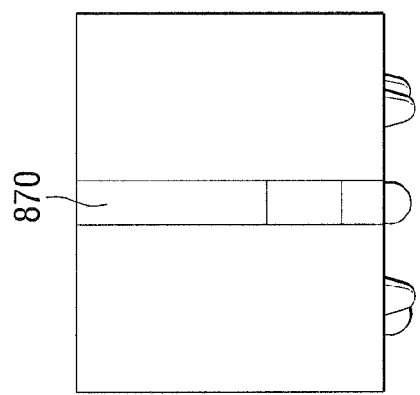
FIGS. 8a-8d show end, side, bottom and perspective views of the buck converter of FIGS. 7a-7c where the high side transistor is encapsulated.
Figure 8D:
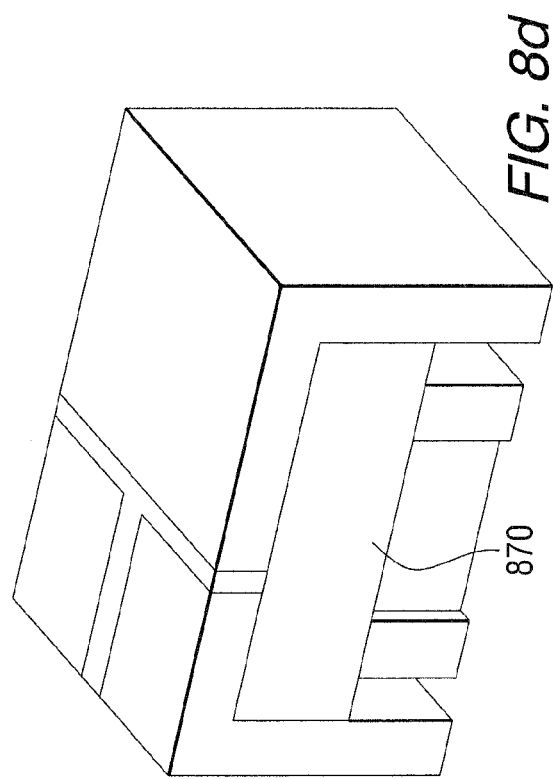
Figure 8A:
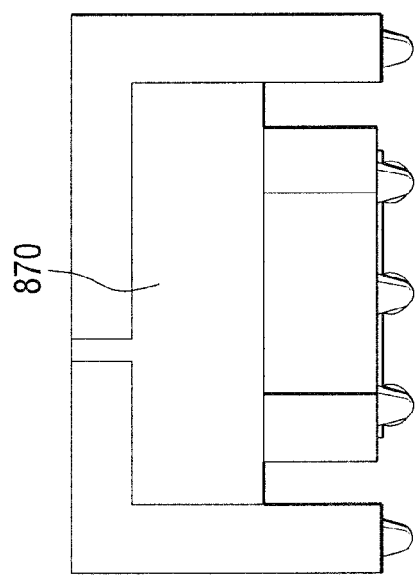
Figure 8C:
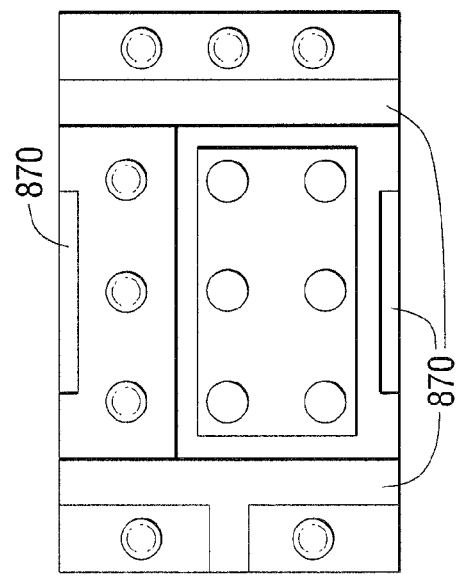

FIGS. 8*a*-8*c* show the same size mosfets configured into a partially molded multichip module 800. Note the presence of the epoxy molding compound 870 in the interstices between and among the pre-molded leadframe 840, the clips 814, 816, and 818. The high side mosfet 812 and the pre-molded leadframe 940 are entirely encapsulated in molding compound 840.

FIGS. 9*a*-9*c* show one embodiment of a buck converter using a pre-molded leadframe 940, a high side mosfet 912, and a low side mosfet 922. Those skilled in the art understand that the ball and/or stud contacts on the bottom of the clips 914, 916, 918 and 926 and the ball contacts for the source and drain of the low side mosfet 922 all lay in a common plane. This feature increases the efficiency of assembling the buck converter multichip module 900 onto a printed circuit board. In this example, the low side mosfet 922 is approximately 4×3.5 mm in size and the entire module 900 is approximately 5×3.5 mm.

Figure 10B:
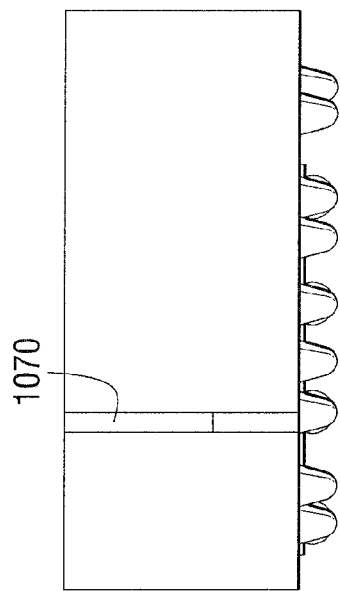
FIGS. 10a-10d show end, side, bottom and perspective views of the buck converter of FIGS. 9a-9c where the high side transistor is encapsulated.
Figure 10D:
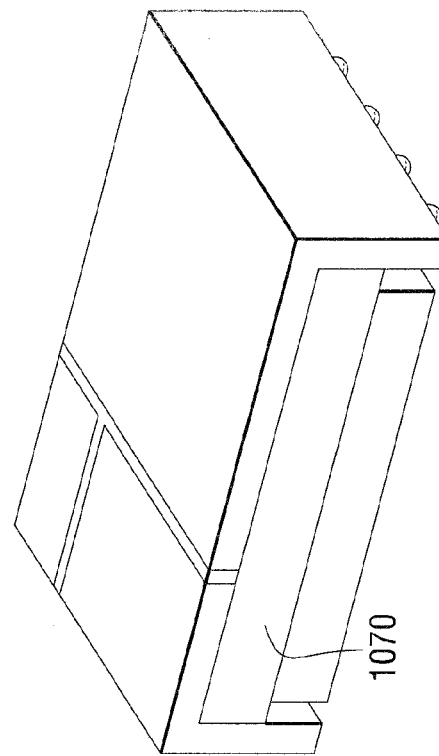
Figure 10A:
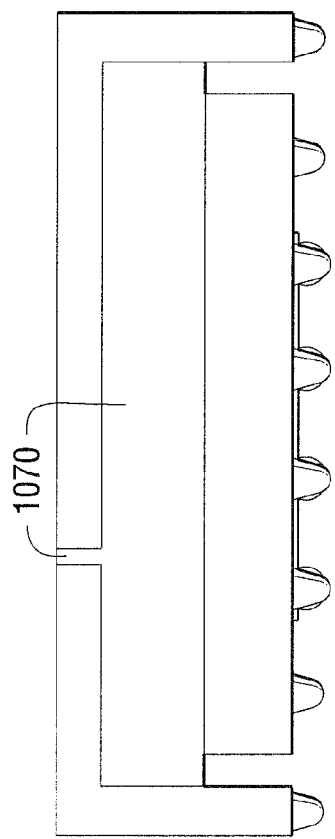
Figure 10C:
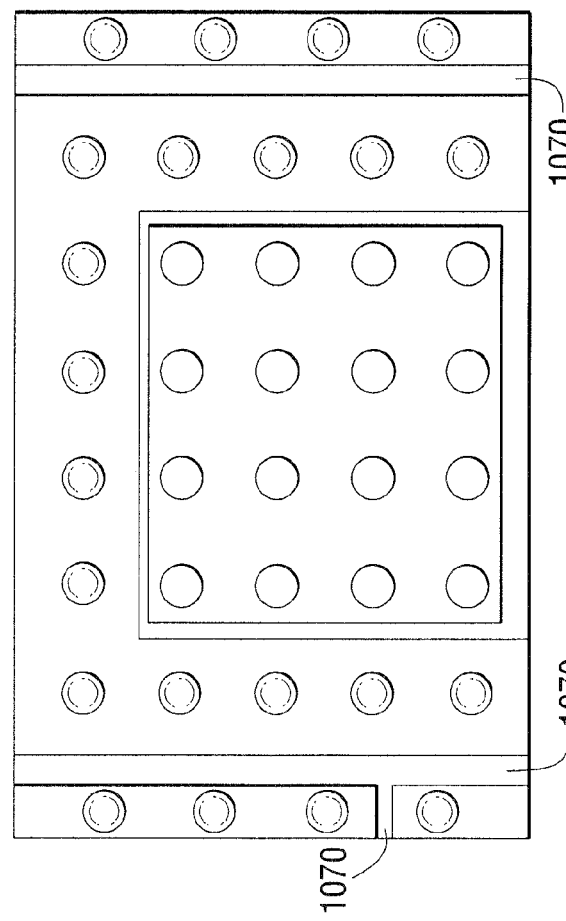

FIGS. 10*a*-10*c* show the same size mosfets configured into a partially molded multichip module 1000. Note the presence of the epoxy molding compound 1070 in the interstices between and among the pre-molded leadframe 1040, the clips 1014, 1016, and 1018. The high side mosfet 1012 and the pre-molded leadframe 940 are entirely encapsulated in molding compound 1040.

The invention claimed is:

1. A stacked buck converter comprising:
   high and low side mosfet transistors for a buck converter, each transistor comprising a semiconductor die with opposite surfaces and each transistor having source and gate terminals on one surface and a drain terminal on the other surface;
   a pre-molded leadframe disposed between the two transistors and mechanically connected to each transistor for electrically connecting the source terminal of one transistor to the drain terminal of the other transistor; and
   conductive clips coupled to the source, gate and drain terminals of the one transistor and to the drain of the other transistor, said conductive clips configured to terminate in a plane approximately parallel to the source and gate terminals of the other transistor.

2. The buck converter of claim 1 wherein the one transistor is a high side power mosfet transistor and the other transistor is a low side power mosfet transistor.

3. The buck converter of claim 1 wherein the one transistor is a low side power mosfet transistor and the other transistor is a high side power mosfet transistor.

4. The stacked buck converter of claim 1 wherein the conductive clips have a first portion extending parallel to the one surface of the die and a second portion extending transverse to the one surface of the die.

5. The stacked buck converter of claim 1 wherein the pre-molded leadframe comprises a conductive material partially encased in electrically insulating material.

6. The stacked buck converter of claim 5 wherein the pre-molded leadframe comprises first and second surfaces with portions of the conductive material exposed to form contacts.

7. The stacked buck converter of claim 6 wherein portions of one surface of the conductive material forms contacts for the source, gate and drain of one transistor and a portion on the other surface of the conductive material is exposed to form a contact for the drain of the other transistor.

8. The stacked buck converter of claim 6 comprising ball attachments on source and gate contacts on the pre-molded leadframe for connecting the source and gate contacts to two of the conductive clips.

9. The stacked buck converter of claim 1 further comprising insulating molding compound for encapsulating the high side transistor.

10. The stacked buck converter of claim 1 wherein the high and low side mosfet transistors are stacked with respect to each other such that there exists a line which intersects, and is orthogonal to, the opposite surfaces of both the high and low side mosfet transistors.

11. The stacked buck converter of claim 10 wherein high and low side mosfet transistors are vertically stacked with respect to each other.

12. A stacked buck converter comprising:
a pre-molded leadframe having first and second opposite sides;
a high side mosfet transistor comprising a semiconductor die with opposite surfaces having source and gate terminals on one surface and a drain terminal on the other surface, the high side mosfet transistor mechanically connected to the first side of the leadframe;
a low side mosfet transistor comprising a semiconductor die with opposite surfaces having source and gate terminals on one surface and a drain terminal on the other surface, the low side mosfet transistor mechanically connected to the second side of the leadframe, the leadframe electrically connecting the source terminal of one transistor to the drain terminal of the other transistor;
conductive clips coupled to the source, gate and drain terminals of the one transistor and to the drain of the other transistor, said conductive clips configured to terminate in a plane approximately parallel to the source and gate terminals of the other transistor.

13. The stacked buck converter of claim 12 wherein the conductive clips have a first portion extending parallel to the one surface of the die and a second portion extending transverse to the one surface of the die.

14. The stacked buck converter of claim 12 comprising ball attachments on source and gate contacts on the pre-molded leadframe for connecting the source and gate contacts to two of the conductive clips.

15. The stacked buck converter of claim 12 further comprising insulating molding compound that encapsulates the high side transistor but not the low side transistor.

* * * * *